(12) United States Patent
Chen et al.

(10) Patent No.: US 11,843,030 B2
(45) Date of Patent: Dec. 12, 2023

(54) FUSE ELEMENTS AND SEMICONDUCTOR DEVICES

(71) Applicant: NANYA TECHNOLOGY CORPORATION, New Taipei (TW)

(72) Inventors: Yi-Ju Chen, Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 99 days.

(21) Appl. No.: 17/691,264

(22) Filed: Mar. 10, 2022

(65) Prior Publication Data

US 2023/0290819 A1    Sep. 14, 2023

(51) Int. Cl.
*H01L 29/78* (2006.01)
*H01L 29/06* (2006.01)
*G11C 11/407* (2006.01)

(52) U.S. Cl.
CPC ........ *H01L 29/0653* (2013.01); *G11C 11/407* (2013.01); *H01L 29/78* (2013.01)

(58) Field of Classification Search
None
See application file for complete search history.

(56) References Cited

U.S. PATENT DOCUMENTS

| | | | | |
|---|---|---|---|---|
| 2007/0058473 A1* | 3/2007 | Kouchi | ................. | G11C 17/16 365/225.7 |
| 2010/0127731 A1* | 5/2010 | Seo | ........................ | G11C 17/18 327/525 |
| 2014/0268984 A1* | 9/2014 | Yanagisawa | ........... | G11C 17/16 365/96 |
| 2015/0008976 A1 | 1/2015 | Kim | | |
| 2015/0137233 A1* | 5/2015 | Xue | .................... | H01L 29/0692 438/294 |
| 2018/0166382 A1* | 6/2018 | Lee | ........................ | H01L 29/423 |

OTHER PUBLICATIONS

Office Action dated May 22, 2023 related to U.S. Appl. No. 17/691,932.

* cited by examiner

*Primary Examiner* — William C Trapanese
(74) *Attorney, Agent, or Firm* — Xuan Zhang

(57) ABSTRACT

A fuse element, a semiconductor device, and a method for activating a backup unit are provided. The fuse element includes an active area, which includes a source region and a drain region beside the source region, a gate region disposed on the active area, and a shallow trench isolation (STI) structure surrounding the active area. In addition, the drain region includes a terminal configured to receive a stress voltage, such that a conductive path is established through the drain region to the source region.

16 Claims, 7 Drawing Sheets

FUSE ELEMENTS AND SEMICONDUCTOR DEVICES

TECHNICAL FIELD

The present disclosure relates to a fuse element and a semiconductor device.

DISCUSSION OF THE BACKGROUND

Fuses and e-fuses are commonly used in memory devices to activate backup units (or redundant memory cells). The fuses and e-fuses can convert the backup unit to a normal circuit for normal operation. For currently-available oxide fuse, its blowing voltage/currents depend on process variation, such that blowing efficiency decreases with inaccuracy. In addition, currently-available fuses are blown at extremely high voltages. Therefore, an improved fuse with a stable and relatively low blowing voltage is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a fuse element. The fuse element includes an active area, which includes a source region and a drain region beside the source region, a gate region disposed on the active area, and a shallow trench isolation (STI) structure surrounding the active area. In addition, the drain region includes a terminal configured to receive a stress voltage, such that a conductive path is established through the drain region to the source region.

Another aspect of the present disclosure provides a semiconductor device including a PMOS. The PMOS includes an active area, which includes a source region and a drain region beside the source region, a gate region disposed on the active area, and a shallow trench isolation (STI) structure surrounding the active area. In addition, the drain region includes a terminal configured to receive a stress voltage, such that a conductive path is established through the drain region to the source region, and wherein the conductive path retains when no external voltage applied on the gate region.

Another aspect of the present disclosure provides a method for activating a backup unit. The method includes providing a fuse element connected to the backup unit. The fuse element includes an active area, which includes a source region and a drain region beside the source region, a gate region disposed on the active area, and a shallow trench isolation (STI) structure surrounding the active area. The method also includes applying a stress voltage on the drain region of the fuse element; accumulating electrons in a portion of the STI structure adjacent to the drain region; generating a conductive path through the drain region and the source region so that the fuse element is conductive; and activating the backup unit through the fuse element.

This subject disclosure provides a fuse element having a structure similar to a PMOS, such that required area of the fuse element can be reduced as manufacturing technologies evolve. The fuse element of the subject disclosure utilizes a stress signal applied on the drain thereof to induce an effect to establish a conductive path through the drain to the source. As the conductive path is established, the fuse element is regarded as blown. That is, irrespective of whether the gate is configured to receive a control signal, the PMOS is turned on. As a result, the channel of the PMOS can be generated without gate voltage. The stress signal to induce this effect is lower than that for conventional fuses.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1B:
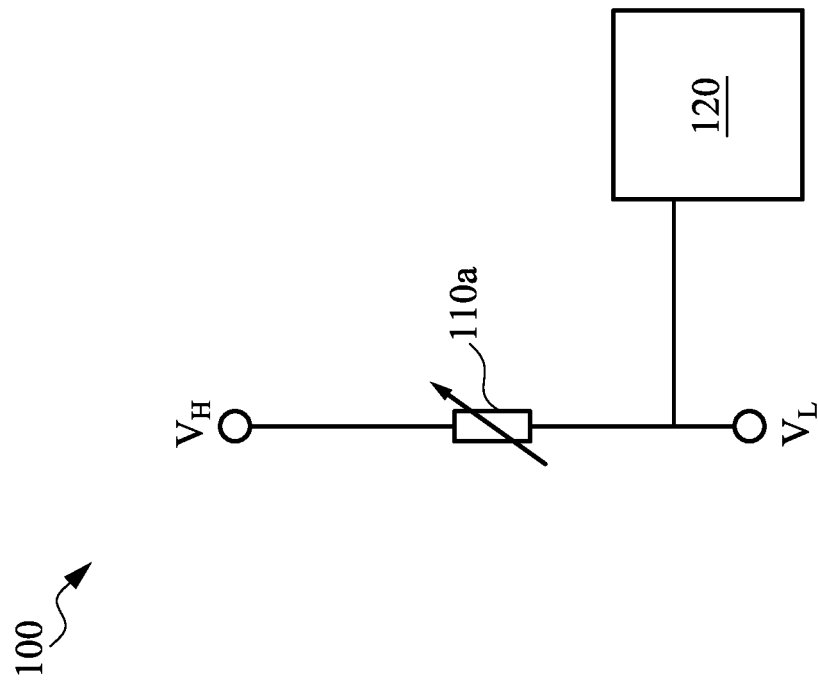
FIGS. 1A and 1B are schematic diagrams of a semiconductor device for activating a backup unit, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Figure 1A:
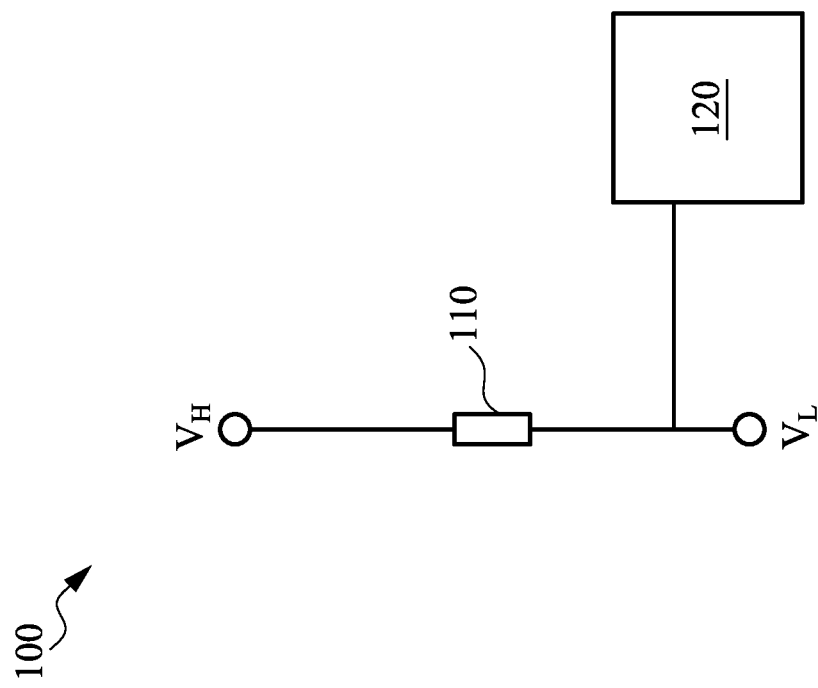

FIGS. 1A and 1B are schematic diagrams of a semiconductor device 100 for activating a backup unit, in accordance with some embodiments of the present disclosure.

Referring to FIG. 1A, the semiconductor device 100 includes a fuse element 110 and a backup unit 120. The difference between FIG. 1A and FIG. 1B is that the semiconductor 100 in FIG. 1B includes a blown fuse element 110a. In some embodiments, the semiconductor device 100 can be a memory, a memory device, a memory die, or a memory chip. For example, the memory can be a dynamic random access memory (DRAM). In some embodiments, the memory includes one or more memory cells (or memory bits/memory blocks). In some embodiments, the memory may include a normal memory cell and a backup unit (a redundant memory cell), which is a backup when the normal memory cell is unavailable.

In some embodiments, the normal memory can include an array of memory cells (not shown). Each of the memory cells is able to store a single bit of information. A specific bit within the array of the normal memory cells is specified by a particular address. Similarly, each redundant memory cell is able to store a single bit of information. A specific bit within the array of the redundant memory cells is specified by a particular address.

The semiconductor device 100 may include only one redundant memory cell 120 connected with other elements through the fuse element 110. In some embodiments, the fuse element 110 can have two terminals. One terminal of the fuse element 110 can be configured to receive the relatively high voltage $V_H$, while another can be coupled to a node with relatively low voltage $V_L$.

The fuse element 110 is fusible by a fuse circuit (not shown). In some embodiments, the fuse element 110 can be an anti-fuse. The fuse element 110 can be an e-fuse. In another embodiment, the fuse element 110 can be an oxide fuse. When the fuse element 110 is not yet blown/fused, it will have a high resistance. The resistance of the fuse element 110 is high enough to disconnect the redundant memory cell 120. Referring to FIG. 1B, when the fuse element 110a is blown/fused, it will have a low resistance. The resistance of the blown fuse element 110a can be low enough to establish a conductive path through the blown fuse element 110a, such that the redundant memory cell 120 can be connected to other elements in the semiconductor device 100, through the blown fuse element 110a.

In some embodiments, the fuse element 110a can be blown after a blowing operation and then connected the redundant memory cell 120 to other elements in the semiconductor device 100. The redundant memory cell 120 can work as a normal memory cell after being connected to other elements in the semiconductor device 100.

In further detail, after the memory 100 fabrication, tests are performed on the memory 100 to determine which, if any, memory cell has defects. When some normal memory cells cannot work, the fuse element 110 can be blown to switch the redundant memory element 120 to a normal memory cell. Therefore, the redundant memory cell can alternatively be referred to as a repair circuit.

Figure 2A:
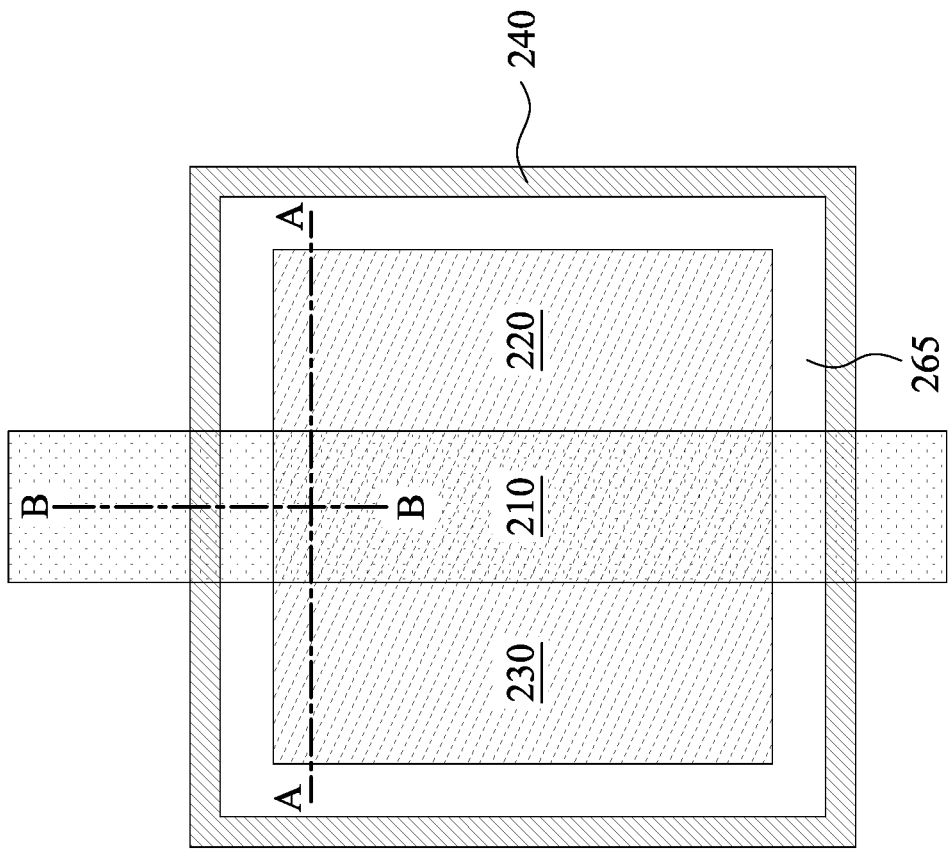
FIG. 2A is a top view of a semiconductor device, in accordance with some embodiments of the present disclosure.

FIG. 2A is a top view of a semiconductor device 200, in accordance with some embodiments. The semiconductor device 200 can include a fuse element. The semiconductor device 200 can include a transistor. For example, the semiconductor device 200 can include a PMOS. FIG. 2A shows section lines A-A and B-B, with details of a cross-section along these section lines provided in FIGS. 2B-2C.

Referring to FIG. 2A, the semiconductor device 200 can include a gate region 210, a drain region 220, a source region 230, a shallow trench isolation (STI) structure 240, and an oxide layer 265. The semiconductor device 200 can include a substrate (not shown in FIG. 2A). In some embodiments, the semiconductor device 200 can include an active area 250 (shown in FIG. 2B and FIG. 2C).

In some embodiments, the active area 250 can include a source region 230 in the semiconductor device 200. In some embodiments, the active area 250 can include a drain region 220 in the semiconductor device 200. The drain region 220 can be disposed beside the source region 230. In some embodiments, the drain region 220 can be separated from the source region 230. In some embodiments, the drain region 220 and the source region 230 can be doped with the same dopants. For example, the drain region 220 and the source region 230 can be doped with P-dopants. In some embodiments, the drain region 220 may have an area different from the source region 230. For example, the area of the drain 220 can exceed that of the source region 230. The drain region 220 may have a width exceeding the source region 230. In another embodiment, the drain region 220 may have a length exceeding the source region 230. In some embodiments, the drain region 220 may have an area identical to the source region 230. In one embodiment, the width of the drain region 220 can be identical to that of the source region 230. In some embodiments, the shape of the drain region 220 can be rectangular. In some embodiments, the shape of the source region 230 can be rectangular. In some embodiments, the drain region 220 and the source region 230 can extend vertically.

The gate region 210 can be disposed on the active area 250. In some embodiments, the gate region 210 can be disposed on the drain region 220 and the source region 230. The gate region 210 can extend vertically. In some embodiments, the gate region 210 can be rectangular. The gate region 210 can be disposed adjacent to the drain region 220. The gate region 210 can be disposed adjacent to the source region 230. In some embodiments, the gate region 210 can be disposed between the drain region 220 and the source region 230.

The STI structure 240 can be disposed around the active area 250. That is, the STI structure 240 can be disposed around the source region 230 and the drain region 220. In some embodiments, the STI structure 240 can surround the active area 250. In some embodiments, the gate region 210 can be disposed on the STI structure 240. In some embodiments, the gate region 210 can be disposed across the STI structure 240.

In some embodiments, the oxide layer 265 can be disposed between the active area 250 and the STI structure 240. The oxide layer 265 can be disposed around the active area 250. That is, the oxide layer 265 can be disposed around the source region 230 and the drain region 220. In some embodiments, the oxide layer 265 can surround the active area 250. In some embodiments, the gate region 210 can be disposed on the oxide layer 265. In some embodiments, the gate region 210 can be disposed across the oxide layer 265.

Figure 2B:
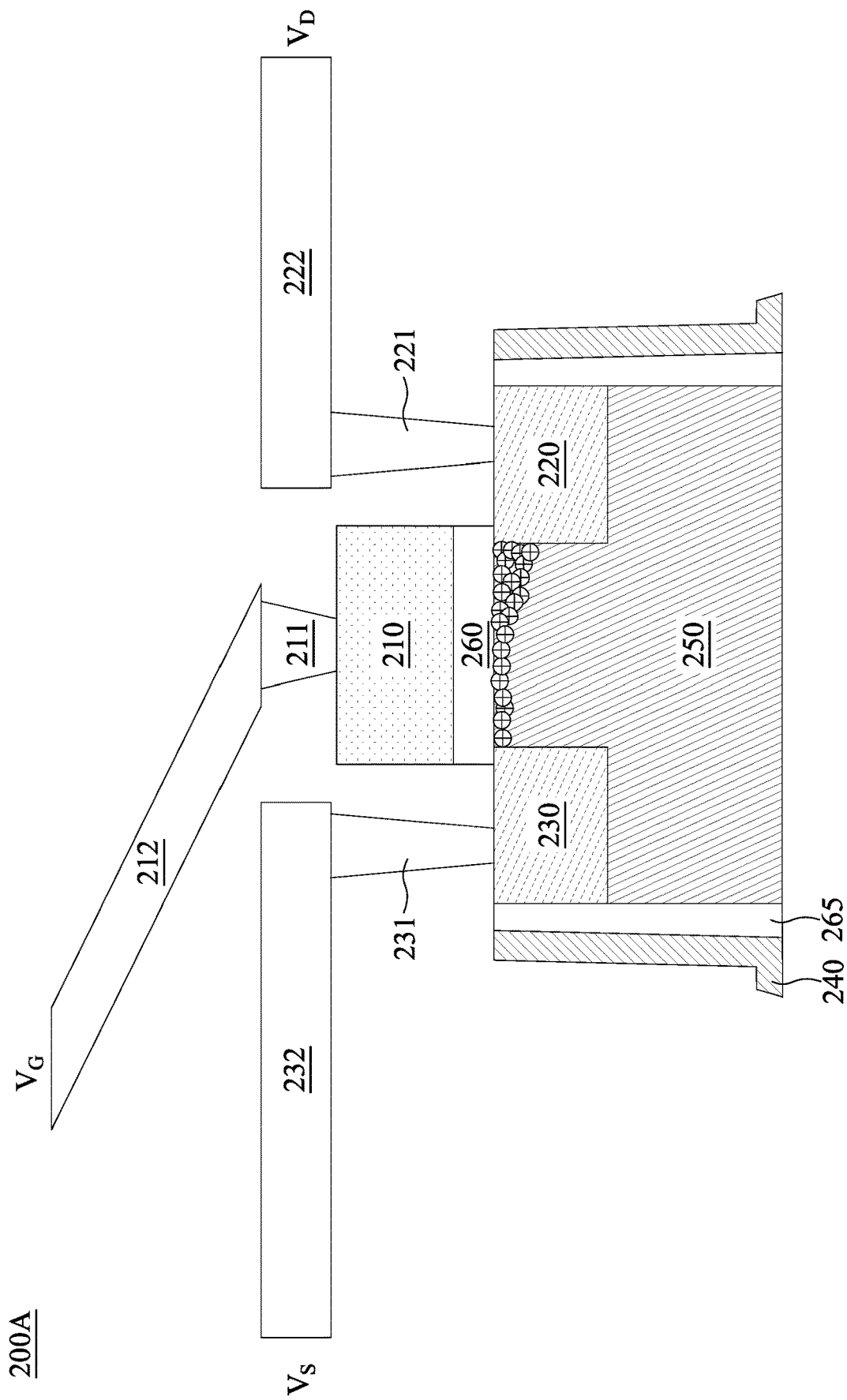
FIG. 2B is a cross-section of a semiconductor device along the section line A-A of FIG. 2A, in accordance with some embodiments of the present disclosure.

FIG. 2B is a cross-section of a semiconductor device 200 along the section line A-A of FIG. 2A, in accordance with some embodiments. FIG. 2B illustrates a semiconductor device 200A which is a cross-section of the semiconductor device 200 of FIG. 2A. The semiconductor device 200A can include a gate region 210, a drain region 220, a source region 230, a STI structure 240, an active area 250, a gate oxide layer 260, an oxide layer 265, contacts 211, 221, and 231, and metal layers 212, 222, and 232. In some embodiments, the semiconductor device 200A can be a PMOS structure.

Referring to FIG. 2B, the active area 250 includes the drain region 220 and the source region 230. In some embodiments, the active area 250 can be doped. For example, the active area 250 can be doped with N-type dopants. In some embodiments, the drain region 220 and the source region 230 can be doped with dopants different with the active area 250. For example, the drain region 220 and the source region 230 can be doped with P-type dopants.

The gate region 210 is disposed on the active area 250. In some embodiments, the gate region 210 can be disposed on the drain region 220 and the source region 230. In one embodiment, a portion of the gate region 210 can overlap with a portion of the drain region 220. In another embodiment, a portion of the gate region 210 can overlap with a portion of the source region 230. In some embodiments, an edge portion of the gate region 210 may overlap with an edge portion of the drain region 220. In some embodiments, an edge portion of the gate region 210 may overlap with an edge portion of the source region 230.

In some embodiments, the gate oxide layer 260 can be disposed between the gate region 210 and the active area 250. In some embodiments, the gate oxide layer 260 can be disposed between the drain region 220 and the source region 230 horizontally. The gate oxide layer 260 can have a width substantially identical to the gate region 210. In some embodiments, the width of the gate oxide layer 260 can exceed that of the gate region 210.

In some embodiments, the gate oxide layer 260 can be disposed on the drain region 220 and the source region 230. In one embodiment, a portion of the gate oxide layer 260 can overlap with a portion of the drain region 220. In another embodiment, a portion of the gate oxide layer 260 can overlap with a portion of the source region 230.

In some embodiments, the gate oxide layer 260 can have a lateral surface coplanar with a lateral surface of the drain region 220. The gate oxide layer 260 can have a lateral surface coplanar with a lateral surface of the source region 230. That is, the width of the gate oxide layer may be identical to the distance between the drain region 220 and the source region 230.

Referring to FIGS. 2A and 2B, the STI structure 240 can be disposed around the active area 250. In some embodiments, the STI structure 240 can surround the active area 250. The STI structure 240 may have an upper surface substantially aligned with an upper surface of the active area 250. In some embodiments, the upper surface of the STI structure 240 may be misaligned with that of the active area 250. The STI structure 240 can be spaced apart from the active area 250 with a distance. In some embodiments, the STI structure 240 can be spaced apart from the drain region 220 with a distance. In some embodiments, the STI structure 240 can include a material of silicon nitride (SiN), or other suitable material.

The oxide layer 265 is disposed between the active area 250 and the STI structure 240. In some embodiments, the oxide layer 265 can surround the active area 250. In some embodiments, the material of the oxide layer 265 can be similar to that of the gate oxide layer 260. In another embodiment, the material of the oxide layer 265 can be different from that of the gate oxide layer 260. The oxide layer 265 may have an upper surface substantially aligned with the upper surface of the active area 250. In some embodiments, the upper surface of the oxide layer 265 may be misaligned with that of the active area 250. In some embodiments, the oxide layer 265 can be a sidewall oxide. The sidewall oxide is disposed adjacent to the drain region 220, the source region 230, or the active area 250.

In some embodiments, the contact 211 is disposed on the gate region 210. The contact 211 can have an upper width and a lower width. In one embodiment, the upper width of the contact 211 can be identical to the lower width. In another embodiment, the upper width of the contact 211 can exceed the lower width. In other words, the contact 211 tapers toward the gate region 210.

In some embodiments, the contact 221 is disposed on the drain region 220. The contact 221 can have an upper width and a lower width. In some embodiments, the upper width of the contact 221 can exceed the lower width. In other words, the contact 221 may taper toward the drain region 220.

In some embodiments, the contact 231 is disposed on the source region 230. The contact 231 can have an upper width and a lower width. In some embodiments, the upper width of the contact 231 can exceed the lower width. In other words, the contact 231 may taper toward the source region 230.

The metal layer 212 can be disposed on the gate region 210. The metal layer 212 is electrically connected to the gate region 210 through the contact 211. In some embodiments, the gate region 210 is configured to receive electrical signal (voltage or current) from the metal layer 212. In some embodiments, a voltage VG of the gate region 210 can be obtained at the metal layer 212.

The metal layer 222 can be disposed on the drain region 220. The metal layer 222 is electrically connected to the drain region 220 through the contact 221. In some embodiments, the drain region 220 is configured to receive electrical signal (voltage or current) from the metal layer 222. In some embodiments, a voltage VD of the drain region 220 can be obtained at the metal layer 222.

The metal layer 232 can be disposed on the source region 230. The metal layer 232 is electrically connected to the source region 230 through the contact 231. In some embodiments, the source region 230 is configured to receive an electrical signal (voltage or current) from the metal layer 232. In some embodiments, a voltage VB of the source region 230 can be obtained at the metal layer 232.

In some embodiments, the metal layer 222 can be level with the metal layer 232. In some embodiments, the metal layer 212 can be level with the metal layer 222. In some embodiments, the metal layer 212 can be level with the metal layer 232. That is, the metal layers 212, 222, and 232 may be substantially on the same level.

Figure 2C:
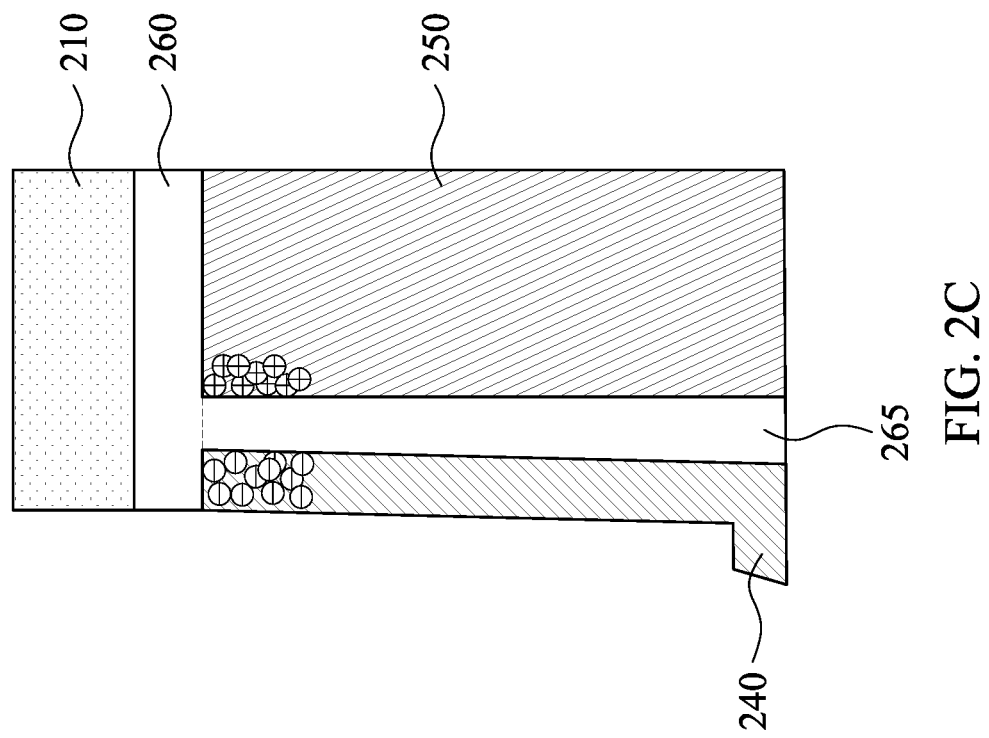
FIG. 2C is a cross-section of a semiconductor device along the section line B-B of FIG. 2A, in accordance with some embodiments of the present disclosure.

FIG. 2C is a cross-section of a semiconductor device 200 along the section line B-B of FIG. 2A, in accordance with some embodiments. FIG. 2C illustrates a semiconductor device 200B which is a cross-section of the semiconductor device 200 of FIG. 2A. The semiconductor device 200B can include a gate region 210, a STI structure 240, an active area 250, a gate oxide layer 260, and an oxide layer 265.

As shown in FIG. 2C, the gate oxide layer 260 is disposed on the oxide layer 265. In some embodiments, the gate oxide layer 260 can be disposed on a portion of the oxide layer 265. The gate oxide layer 260 can be disposed on the STI structure 240. In some embodiments, the gate oxide layer 260 can be disposed on a portion of the STI structure 240. In some embodiments, the STI structure 240 can be spaced apart from the active area laterally by a distance. In some embodiments, the oxide layer 265 can be filled between the STI structure 240 and the active area 250.

Referring back to FIG. 2B, the metal layer 222 of the drain region 220 can be configured to receive a stress voltage. In some embodiments, the stress voltage can have a magnitude exceeding an operating voltage of the semiconductor device (or PMOS) 200A. For example, the magnitude of the stress voltage can be more than twice the operating voltage. When the operating voltage of the PMOS 200A is −2.5V, the stress voltage can be less than −5V.

When the stress voltage is applied on the drain region 220, electrons accumulate in the drain region 220, which is doped with N-type dopants. The accumulated electrons in the drain region 220 can lead to electron holes accumulated in the portion of the active area 250, which is doped with P-type dopants. In some embodiments, the electron holes may accumulate in the portion of the active area 250 adjacent to the drain region 220. In some embodiments, the electron holes may accumulate in the portion of the active area 250 between the drain region 220 and the source region 230. Since the electron holes are accumulated in the portion of the active area 250 (as shown in FIG. 2C), the electrons can accumulate in the portion of the STI structure 240. In some embodiments, the accumulated electrons in the portion of the STI structure 240 can correspond to the portion of the active area 250 accumulated electron holes. Therefore, the electrons accumulate in the portion of the STI structure 240 adjacent to the portion of the active area 250, which is adjacent to the drain region 220. In some embodiments, the electrons may accumulate in the portion of the STI structure 240 adjacent to the drain region 220.

In some embodiments, the electrons are easily trapped in the STI structure 240 once attracted by the electron holes in the portion of the active area 250. The electrons can be trapped in the STI structure 240 (as shown in FIG. 2C) even though the stress voltage is no longer applied to the drain region 220. Accordingly, the electron holes still accumulate in the portion of the active area 250 due to the trapped electrons in the STI structure 240, so that a conductive path (as shown in FIG. 2B) can be established through the drain region 220 to the source region 230.

Under normal operation of the PMOS 200A, the conductive path through the drain region 220 to the source region 230 can be established with a gate voltage applied on the gate region 210. On the contrary, the conductive path can be established free of a voltage applied on the gate region after the electrons trapped in the STI structure 240. The PMOS 200A can be a fuse element with high resistance before the stress voltage is applied, where the fuse element is not yet blown. After the stress voltage is applied on the drain region 220 to accumulate electrons in the STI structure 240, the fuse element 200A can be blown to lower resistance.

To activate this effect or to blow the fuse element 200, the STI structure 240 and the active area 250 must be sufficiently close. For example, the distance between the STI structure 240 and the active area 250 can be less than 14 nm, whereby electrons can be easily trapped in the STI structure 240. In some embodiments, the PMOS 200 can be a short channel device. The channel of the PMOS 200 can be located between the drain region 220 and the source region 230. In some embodiments, a length of the channel of the PMOS 200 can be the distance between the drain region 220 and the source region 230. With the shorter channel, the PMOS 200 can be easily blown. For example, the length of the channel can be less than 0.20 μm. In some embodiments, the length of the channel can be less than 0.18 μm. In some embodiments, the PMOS 200 can be a planar transistor.

The currently-available oxide fuse element is blown with an extremely high voltage to break through the gate oxide. The breakdown voltage of the oxide fuse element may vary due to the process variation, such that the efficiency of the oxide fuse element would be decreased. The subject disclosure provides a fuse element can be blown at a relatively low voltage. Comparing to the traditional anti fuse, the fuse element of this subject disclosure requires reduced area.

Figure 3:
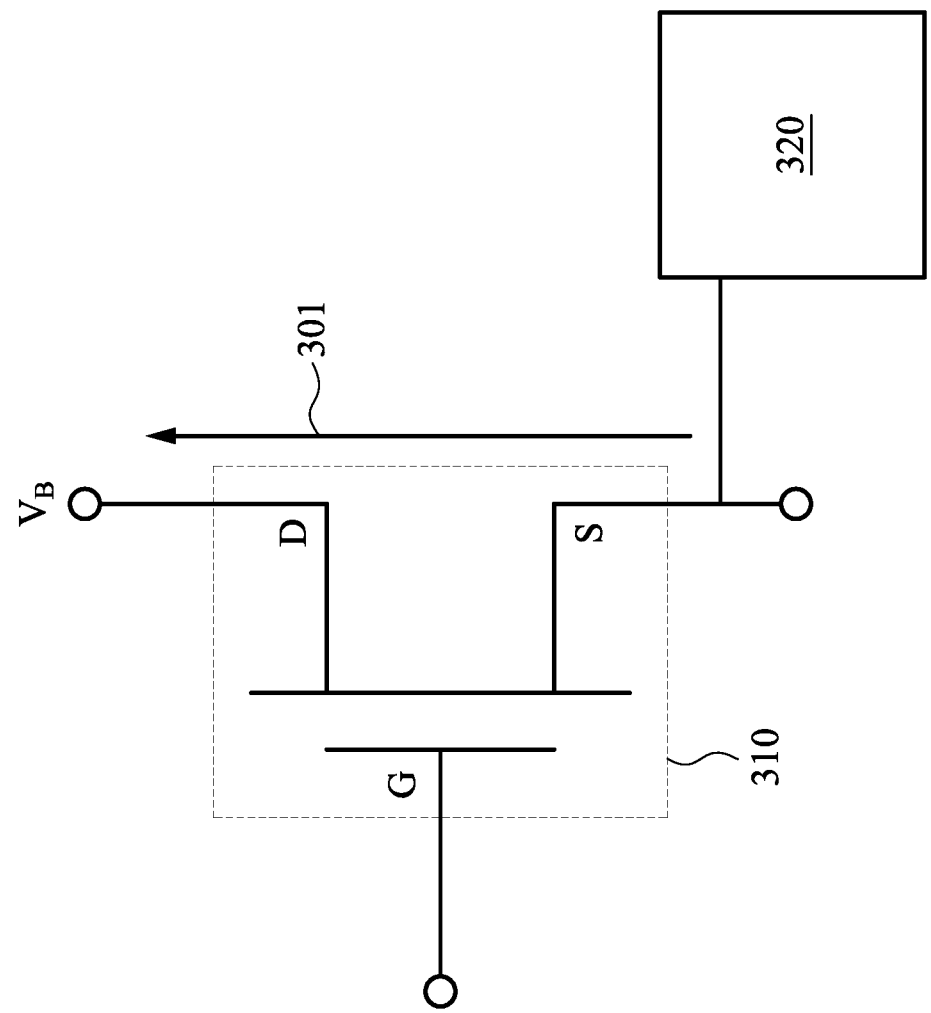
FIG. 3 is a schematic diagram of a semiconductor device, in accordance with some embodiments of the present disclosure.

FIG. 3 is a schematic diagram of a semiconductor device 300, in accordance with some embodiments of the present disclosure. The semiconductor device 300 includes a fuse element 310 and a backup unit 320. In some embodiments, the backup unit 320 can correspond to as the backup unit 120 in FIGS. 1A and 1B.

In some embodiments, the fuse element 310 can be the fuse element 200 as described. The fuse element 310 can have a gate terminal, a drain terminal, and a source terminal. In some embodiments, the backup unit 320 can be electrically connected to the source terminal of the fuse element 320. The gate terminal, the drain terminal, and the source terminal of the fuse element 310 can be configured to receive voltage or current. In some embodiments, the source terminal may be configured to receive a power signal. When the fuse element 310 is not yet blown, the backup unit 320 cannot be activated due to insufficient current therethrough. Before the fuse element 310 is blown, the fuse element 310 has a high resistance drain terminal and the source terminal. Therefore, the backup unit 320 is regarded as disconnected.

To activate the fuse element 310, the stress signal VB (voltage or current) can be applied on the drain terminal of the fuse element 310. Accordingly, the electrons accumulate in a portion of the STI structure of the fuse element 310, such that the conductive path 301 through the drain terminal and the source terminal can be generated. In other words, the blown fuse element 310 can be conductive. After the fuse element 310 is blown, it has a conductive path 301 through the drain terminal to the source terminal, and thus the backup unit 320 can be activated.

Figure 4:
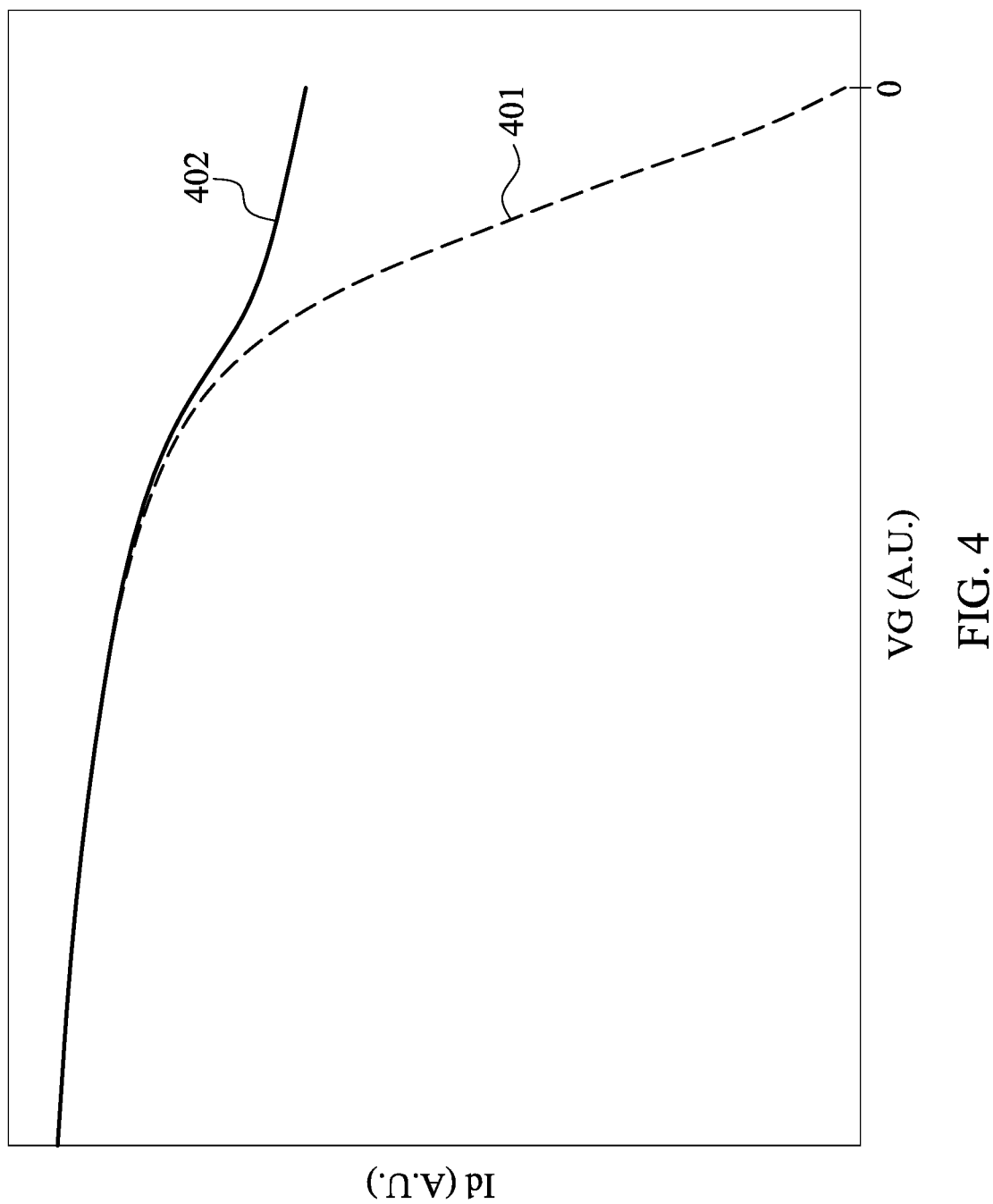
FIG. 4 is a graph illustrating the voltage of a gate versus the current flowing through the drain of a semiconductor device, in accordance with some embodiments of the present disclosure.

FIG. 4 is a graph 400 illustrating voltage VG of a gate versus current Id through the drain of a semiconductor device, in accordance with some embodiments. Referring to FIG. 4, the x-axis represents the voltage VG of the gate of the fuse element 310 in FIG. 3 in arbitrary unit (A.U.). The y-axis represents the current Id passing through the drain of the fuse element 310 in FIG. 3 in arbitrary unit (A.U.). The line 401 shows that the unblown fuse element 310 operates as a normal PMOS. According to the line 401, the unblown fuse element 310 can have increasing current Id through the drain (from the source to the drain) with decreasing voltage VG, where the decreasing voltage means greater magnitude of voltage. The line 402 shows that the blown fuse element 310 is conductive even though it is free from voltage applied on the gate thereof. According to the line 402, the blown fuse element 310 has the current Id through the drain region when voltage VG is zero.

Figure 5:
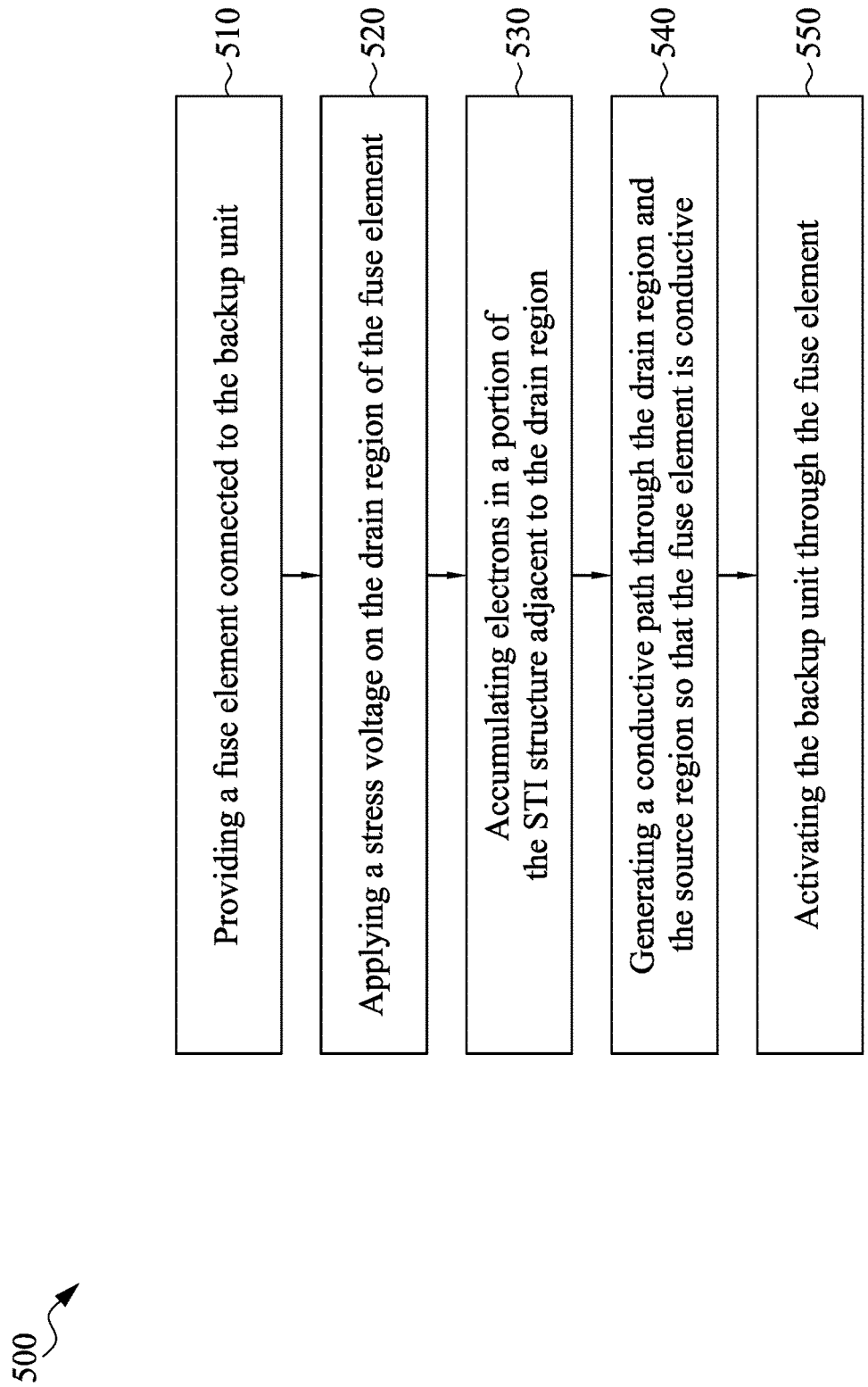
FIG. 5 is a flowchart of a method for activating a backup unit, in accordance with some embodiments of the present disclosure.

FIG. 5 is a flowchart of a method 500 for activating a backup unit, in accordance with some embodiments of the present disclosure. In some embodiments, this method can be conducted on the semiconductor device 300 in FIG. 3. The method 500 can be utilized to activating a backup unit 320 as shown in FIG. 3. In some embodiments, the method 500 for activating a backup unit of a memory may include operations 510, 520, 530, 540, and 550.

For better understanding, the method 500 may be described with reference to the semiconductor device (fuse element or PMOS) 200/200A/200B/310 shown in FIGS. 2A-2C and 3.

In operation 510, a fuse element can be provided in a memory. The fuse element can be connected to the backup unit (redundant memory cell or bit). In some embodiments, the fuse element 200/200A/200B can include an active area, a gate region disposed on the active area, and a STI structure surrounding the active area. In some embodiments, the active area includes a source region and a drain region beside the source region.

In operation 520, a stress voltage can be applied on the drain region of the fuse element. Details of the stress voltage are provided previously and thus omitted herefrom for clarity.

In operation 530, electrons can accumulate in a portion of the STI structure adjacent to the drain region. As shown in FIGS. 2B and 2C, the electrons can accumulate in the portion of the STI structure adjacent to the active area and the drain region, since the stress voltage is applied on the drain region.

In operation 540, a conductive path can be generated through the drain region and the source region of the fuse element so that the fuse element can be conductive. According to the description related to FIGS. 2B and 2C, with electrons accumulated in the portion of the STI structure, the fuse element can have a conductive path through the drain region to the source region. In other words, the channel of the PMOS can be generated in response to the trapped electrons in STI structure.

In operation 550, the backup unit 320 can be activated through the blown fuse element 310. In some embodiments, the backup unit 320 can be electrically connected to other elements through the blown fuse element 310. That is, the backup unit 320 can be switched from redundant to normal.

One aspect of the present disclosure provides a fuse element. The fuse element includes an active area, which includes a source region and a drain region beside the source region, a gate region disposed on the active area, and a shallow trench isolation (STI) structure surrounding the active area. In addition, the drain region includes a terminal configured to receive a stress voltage, such that a conductive path is established through the drain region to the source region.

Another aspect of the present disclosure provides a semiconductor device including a PMOS. The PMOS includes an active area, which includes a source region and a drain region beside the source region, a gate region disposed on the active area, and a shallow trench isolation (STI) structure surrounding the active area. In addition, the drain region includes a terminal configured to receive a stress voltage, such that a conductive path is established through the drain region to the source region, and wherein the conductive path is retained when no external voltage is applied on the gate region.

Another aspect of the present disclosure provides a method for activating a backup unit. The method includes providing a fuse element connected to the backup unit. The fuse element includes an active area, which includes a source region and a drain region beside the source region, a gate region disposed on the active area, and a shallow trench isolation (STI) structure surrounding the active area. The method also includes applying a stress voltage on the drain region of the fuse element, accumulating electrons in a portion of the STI structure adjacent to the drain region, generating a conductive path through the drain region and the source region so that the fuse element is conductive, and activating the backup unit through the fuse element.

This subject disclosure provides a fuse element with a structure similar to a PMOS. Therefore, the required area of the fuse element is reduced. The fuse element of this subject disclosure utilizes a stress signal applied on the drain thereof to establish a conductive path through the drain to the source. As the conductive path is established, the fuse element is regarded as blown. That is, no matter whether the gate is configured to receive a control signal, the PMOS will be turned on. In other words, the channel of the PMOS can be generated without gate voltage. The stress signal to induce this effect is lower than fuses in conventional practice.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A fuse element, comprising:
an active area, including:
a source region; and
a drain region beside the source region,
a gate region disposed on the active area;
a shallow trench isolation (STI) structure surrounding the active area, and
an oxide layer filled between the STI structure and the active area;
wherein the drain region includes a terminal configured to receive a stress voltage, such that a conductive path is established through the drain region to the source region, wherein the stress voltage has a magnitude greater than 5V.

2. The fuse element of claim 1, wherein the fuse element includes a PMOS.

3. The fuse element of claim 2, wherein the PMOS is a short channel device having a channel length less than 0.2 µm.

4. The fuse element of claim 2, wherein the stress voltage has a magnitude greater than two times an operating voltage of the PMOS.

5. The fuse element of claim 1, wherein the STI structure is spaced apart from the active area laterally with a distance.

6. The fuse element of claim 1, wherein the distance between the STI structure and the active area is less than 14 nm.

7. The fuse element of claim 1, wherein the conductive path is established free from a voltage applied on the gate region.

8. The fuse element of claim 1, wherein the STI structure includes a material of silicon nitride (SiN).

9. The fuse element of claim 1, further comprising a gate oxide layer disposed between the gate region and the active area.

10. A semiconductor device, comprising:
a PMOS, comprising:
an active area, including:
a source region; and
a drain region beside the source region,
a gate region disposed on the active area;
a shallow trench isolation (STI) structure disposed around the active area, and
an oxide layer filled between the STI structure and the active area;
wherein the drain region includes a terminal configured to receive a first voltage, such that a conductive path is established from the drain region to the source region, and wherein the conductive path retains when no external voltage is applied on the gate region, wherein the STI structure is spaced apart from the active area laterally with a distance.

11. The semiconductor device of claim 10, wherein the distance between the STI structure and the active area is less than 14 nm.

12. The semiconductor device of claim 10, wherein the first voltage has a magnitude greater than two times an operating voltage of the PMOS.

13. The semiconductor device of claim 10, wherein the first voltage has a magnitude greater than 5V.

14. The semiconductor device of claim 10, wherein the STI structure includes a material of silicon nitride (SiN).

15. The semiconductor device of claim 10, wherein the PMOS is a short channel device having a channel length less than 0.2 µm.

16. The semiconductor device of claim 10, further comprising a gate oxide layer disposed between the gate region and the active area.

* * * * *